(12) United States Patent
Kimino

(10) Patent No.: US 7,731,076 B2
(45) Date of Patent: Jun. 8, 2010

(54) LASER TRIMMING PROBLEM SUPPRESSING SEMICONDUCTOR DEVICE MANUFACTURING APPARATUS AND METHOD

(75) Inventor: Kazunari Kimino, Hyogo-Ken (JP)

(73) Assignee: Ricoh Company, Ltd., Tokyo (JP)

( * ) Notice: Subject to any disclaimer, the term of this patent is extended or adjusted under 35 U.S.C. 154(b) by 0 days.

(21) Appl. No.: 12/213,332

(22) Filed: Jun. 18, 2008

(65) Prior Publication Data
US 2009/0061628 A1 Mar. 5, 2009

Related U.S. Application Data

(62) Division of application No. 10/793,888, filed on Mar. 8, 2004, now Pat. No. 7,404,511.

(30) Foreign Application Priority Data

Mar. 7, 2003 (JP) ............................. 2003-061213

(51) Int. Cl.
*B23K 31/02* (2006.01)
(52) U.S. Cl. ................. 228/180.21; 228/215; 228/248.1
(58) Field of Classification Search ........................ None
See application file for complete search history.

(56) References Cited

U.S. PATENT DOCUMENTS

| | | | |
|---|---|---|---|
| 4,057,476 A | | 11/1977 | Krikorian et al. |
| 5,919,520 A | | 7/1999 | Tateyama et al. |
| 6,069,065 A | * | 5/2000 | Arimoto et al. ............. 438/612 |
| 6,082,605 A | | 7/2000 | Farnworth |
| 6,153,256 A | * | 11/2000 | Kambara et al. ............ 427/103 |
| 6,320,139 B1 | * | 11/2001 | Byle et al. .................. 174/261 |
| 6,357,111 B1 | | 3/2002 | Uchiyama |
| 6,589,594 B1 | | 7/2003 | Hembree |
| 6,664,482 B1 | * | 12/2003 | Shaeffer et al. ............. 174/261 |
| 7,140,531 B2 | * | 11/2006 | Shaeffer et al. .......... 228/248.1 |
| 7,199,304 B2 | * | 4/2007 | Wienrich et al. ............ 174/254 |
| 7,410,093 B2 | * | 8/2008 | Miller et al. ................ 228/260 |

(Continued)

FOREIGN PATENT DOCUMENTS

JP 58139457 A 8/1983

(Continued)

OTHER PUBLICATIONS

Japanese Office Action; Jun. 21, 2009; 3 pages.

*Primary Examiner*—Kiley Stoner
(74) *Attorney, Agent, or Firm*—Dickstein Shapiro LLP

(57) ABSTRACT

A semiconductor device manufacturing apparatus includes a substrate holding section that holds a semiconductor wafer substrate, a discharge mechanism that discharges liquid drops of metal paste from a discharge nozzle toward a surface of the semiconductor wafer substrate, and a driving mechanism that moves at least one of the substrate holding section and the discharge nozzle. A control section is provided to control the discharge and driving mechanisms so as to adhere the metal paste to the surface. The semiconductor wafer substrate includes a terminal unit formed from two or more electrically separated terminals connected to a device circuit and an insulation layer having an opening in a formation position of the terminal unit. Further, the control section controls the discharge and driving mechanisms to selectively coat the opening of the semiconductor wafer substrate with the metal paste overlying the terminal unit to be electrically connected.

6 Claims, 17 Drawing Sheets

U.S. PATENT DOCUMENTS

| | | | |
|---|---|---|---|
| 7,412,923 B2 * | 8/2008 | Shaeffer et al. | 101/127 |
| 2003/0017687 A1 | 1/2003 | Hembree | |
| 2003/0096089 A1 * | 5/2003 | Huang et al. | 428/209 |
| 2004/0217193 A1 * | 11/2004 | Holm et al. | 239/112 |
| 2006/0194402 A1 * | 8/2006 | Tanimura | 438/381 |

FOREIGN PATENT DOCUMENTS

| | | |
|---|---|---|
| JP | 05138858 A | 6/1993 |
| JP | 2911980 | 4/1999 |
| JP | 11-274671 | 10/1999 |
| JP | 2000-150799 | 5/2000 |
| JP | 2000-323576 | 11/2000 |
| JP | 2002151837 A | 5/2002 |
| WO | WO 02/052627 | 7/2002 |

* cited by examiner

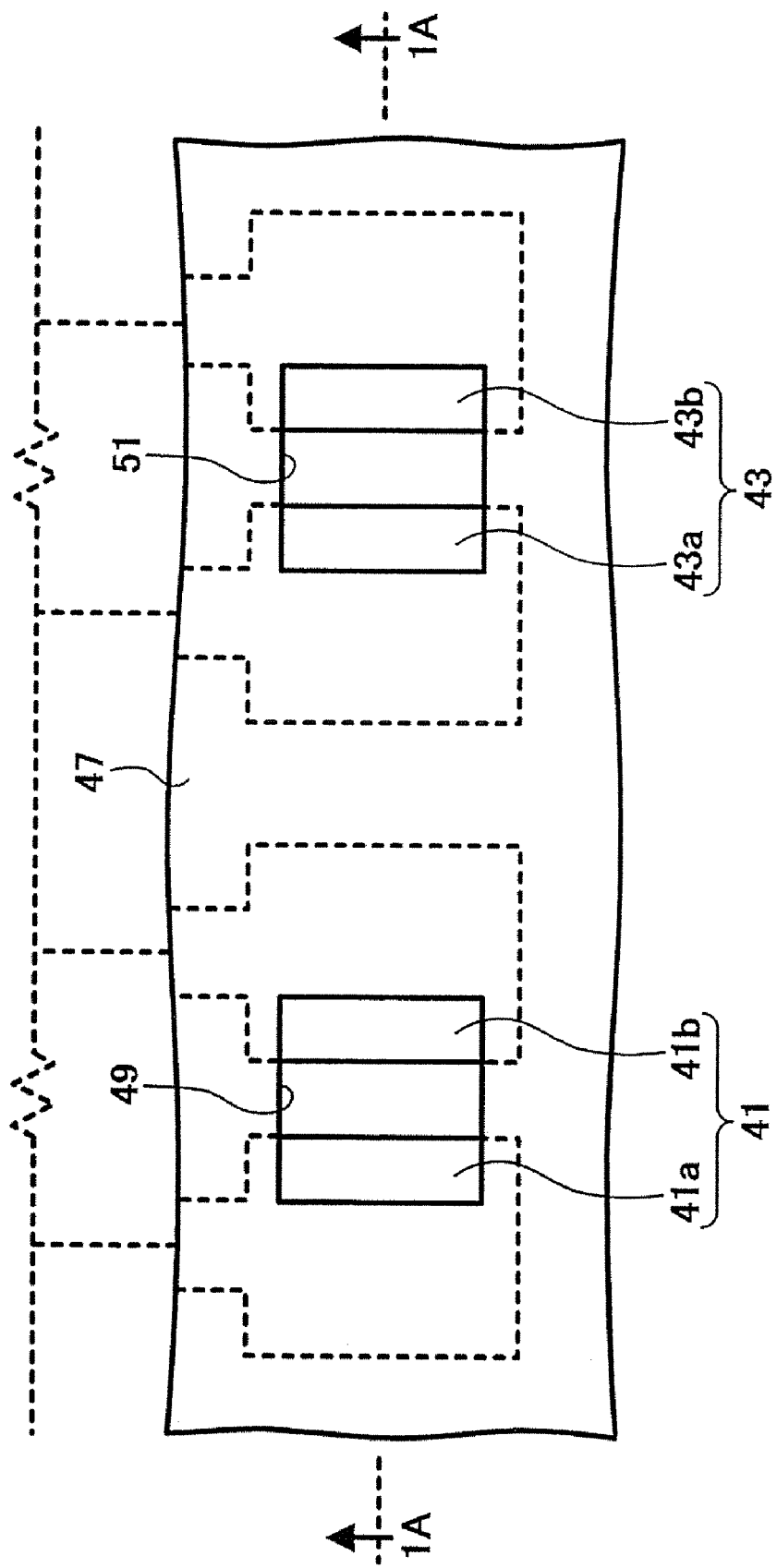

US 7,731,076 B2

LASER TRIMMING PROBLEM SUPPRESSING SEMICONDUCTOR DEVICE MANUFACTURING APPARATUS AND METHOD

CROSS REFERENCE TO RELATED APPLICATION

This is a divisional application of U.S. patent application Ser. No. 10/793,888, filed on Mar. 8, 2004, now U.S. Pat. No. 7,404,511 which claims priority under 35 USC §119 to Japanese Patent Application No. 2003-061213 filed on Mar. 7, 2003, the entire contents of each of which are herein incorporated by reference.

COPYRIGHT NOTICE

A portion of the disclosure of this patent document contains material which is subject to copyright protection. The copyright owner has no objection to the facsimile reproduction by anyone of the patent document or the patent disclosure, as it appears in the Patent and Trademark Office patent file or records, but otherwise reserves all copyright rights whatsoever.

BACKGROUND

1. Field of the Invention

The present invention relates generally to a semiconductor device manufacturing apparatus and method, and in particular to a semiconductor device manufacturing apparatus and method capable of suppressing laser trimming problems.

2. Discussion of the Background Art

Laser trimming is a well known method of cutting one of fuse elements formed on a semiconductor wafer substrate fuses are cut at an appropriate position with a laser beam in order to adjust an electric performance of a semiconductor device having an analog circuit. Cutting is performed before division of a semiconductor wafer substrate into a plurality of chips, as discussed in Japanese Patent Application Laid Open No. 2000-323576.

A constant voltage generation circuit and a voltage detection circuit are typical examples of such an analog circuit.

FIG. 14 illustrates a semiconductor device including a constant voltage generation circuit 81 that stably supplies power from a direct current power source 77 to a load 79. The constant voltage generation circuit 81 includes an input terminal Vbat 83 to which the direct current power supply 77 is connected, a reference voltage generation circuit 85, an operational amplifier 87, a P-channel type MOS transistor 89 (hereinafter referred to as a PMOS) constituting an output driver, a voltage divider formed by a pair of division resistances R1 and R2, and an output terminal Vout 91.

In the operational amplifier 87, an output terminal is connected to a gate electrode of the PMOS 89. A reference voltage Vref is applied from the reference voltage generation circuit 85 to an inversion input terminal. A voltage obtained by dividing an output voltage Vout with the pair of resistances R1 and R2 is applied to a non-inversion input terminal. The voltage is thus controlled to equal the reference voltage Vref.

Another semiconductor device including a voltage detection circuit 93 is illustrated in FIG. 15. As shown in the voltage detection circuit 93, an operational amplifier 87 is provided, and a reference voltage generation circuit 85 is connected to an inversion input terminal to receive a reference voltage Vref. A terminal voltage to be measured from an input terminal Vsens 95 is divided by the voltage divider R1 and R2 and is input to a non-inversion input terminal of the operational amplifier 87. The operational amplifier 87 then outputs a signal via an output terminal 97.

In the voltage detection circuit 93, when the terminal voltage to be measured is high, and accordingly, a voltage divided by the voltage divider R1 and R2 is higher than the reference voltage Vref, an output of the operational amplifier 87 maintains a high level. In contrast, when the terminal voltage to be measured descends and accordingly, a voltage divided by the voltage divider R1 and R2 is lower than the reference voltage Vref, an output of the operational amplifier 87 becomes low.

In general, since a reference voltage Vref transmitted from a reference voltage generation circuit varies from chip to chip due to imprecision in a manufacturing process for the constant voltage generation circuit of FIG. 14 and the voltage detection circuit of FIG. 15, tunable division resistances are utilized to change and adjust a resistance value by cutting fuse elements at an appropriate position in order to adjust for the imprecision.

FIG. 16 illustrates still another semiconductor device including a circuit having tunable division resistances for adjusting a resistance value. As shown, a resistance element Rbottom, m+1 items of resistance elements RT0 to RTm, and a resistance element Rtop are serially connected, wherein a sign "m" represents a positive integer. To the resistance elements RT0 to Rtm, fuse elements RL0 to RLm are connected in parallel, respectively, as discussed in Japanese Patent Application Laid Open No. 2000-150799.

When a faulty division resistance unbalances a resistance ratio between a pair of resistances, in order to increase a manufacturing precision in a manufacturing process, corrections are made using a tunable resistance circuit formed from units of a resistance element and a fuse element serially connected and arranged in a ladder. Such a division resistance is corrected by optionally cutting one of fuse elements RL0 to RLm with a laser beam. Accordingly, a prescribed serial resistance value can be obtained between a NodeM, between the resistance elements Rtop and RTm, and a NodeL, between the resistance elements Rbottom and RT0.

When the tunable resistances of FIG. 16 are applied to the voltage divider R1 and R2 of the constant voltage generation circuit of FIG. 14, an end of the resistance element Rbottom is grounded, an end of the resistance element Rtop is connected to a drain of PMOS89, and a terminal NodeL is connected to a non-inversion input terminal of the operational amplifier 87, for example. Otherwise, an end of the resistance element Rbottom is grounded, an end of the resistance element Rtop is connected to the drain of the PMOS89, and the terminal NodeM is connected to the non-inversion input terminal of the operational amplifier 87.

Further, when the tunable resistances of FIG. 16 are applied to the voltage divider R1 and R2 of the voltage detection circuit of FIG. 15, an end of the resistance element Rbottom is grounded, an end of the resistance element Rtop is connected to an input terminal 95, and a terminal NodeL is connected to the non-inversion input terminal of the operational amplifier 87, for example. Otherwise, an end of the resistance element Rbottom is grounded, an end of the resistance element Rtop is connected to the direct current power source 77, and the terminal NodeM is connected to the non-inversion input terminal of the operational amplifier 87.

However, various problems are raised when the fuse element is cut by irradiation with a laser beam. Specifically, a laser trimming apparatus irradiating the laser beam is expensive. A running cost of the laser trimming apparatus is high. A peripheral protection film and a substrate film of the fuse element are damaged by the laser beam. In addition, a fuse element material or the like scatters around an opening section when the fuse is being melted.

SUMMARY

Accordingly, an object of the present invention is to address and resolve such problems and provide a new semiconductor device manufacturing apparatus including a substrate holding section configured to hold a semiconductor wafer substrate, a discharge mechanism operative to discharge liquid drops of metal paste from a discharge nozzle toward the semiconductor wafer substrate, and a driving mechanism configured to move at least one of the substrate holding section and the discharge nozzle. A control section is provided to control the discharge and driving mechanisms so as to apply the metal paste accurately to the semiconductor wafer substrate. A terminal unit formed from at least two electrically separated terminals is formed overlying the surface of the semiconductor wafer substrate and is connected to device circuitry. An insulation layer having an opening is also formed overlying the terminal unit. Further, the control section controls the discharge and driving mechanisms to selectively coat the opening of the semiconductor wafer substrate with the metal paste overlying the terminal unit to be electrically connected.

In another embodiment, the discharge mechanism includes a plurality of discharge nozzles.

In still another embodiment, the substrate holding section includes a substrate temperature control mechanism configured to control the temperature of the semiconductor wafer substrate.

In still another embodiment, the manufacturing apparatus includes plural types of discharge mechanisms, each configured to discharge a different amount of liquid.

In still another embodiment, the discharge and driving mechanisms are operated to discharge less of the liquid metal paste in the vicinity of the margin of an opening section.

In still another embodiment, several types of discharge mechanisms are provided. A plurality of metal paste containers is assigned to each of the discharge mechanisms, respectively. The metal pastes stored in the metal paste containers have different respective electronic resistances.

In still another embodiment, a plastic temperature control mechanism is provided in the discharge mechanism so as to control the temperature of the metal paste stored in the metal paste containers.

In still another embodiment, an uncured sealant discharge mechanism discharges uncured sealant instead of the metal paste.

BRIEF DESCRIPTION OF DRAWINGS

A more complete appreciation of the present invention and many of the attendant advantages thereof will be readily obtained as the same becomes better understood from the following detailed description when considered in connection with the accompanying drawings, wherein:

FIG. 4 illustrates regions in which terminal units are formed overlying a semiconductor wafer substrate;

PREFERRED EMBODIMENTS OF THE PRESENT DISCLOSURE

Figure 2:
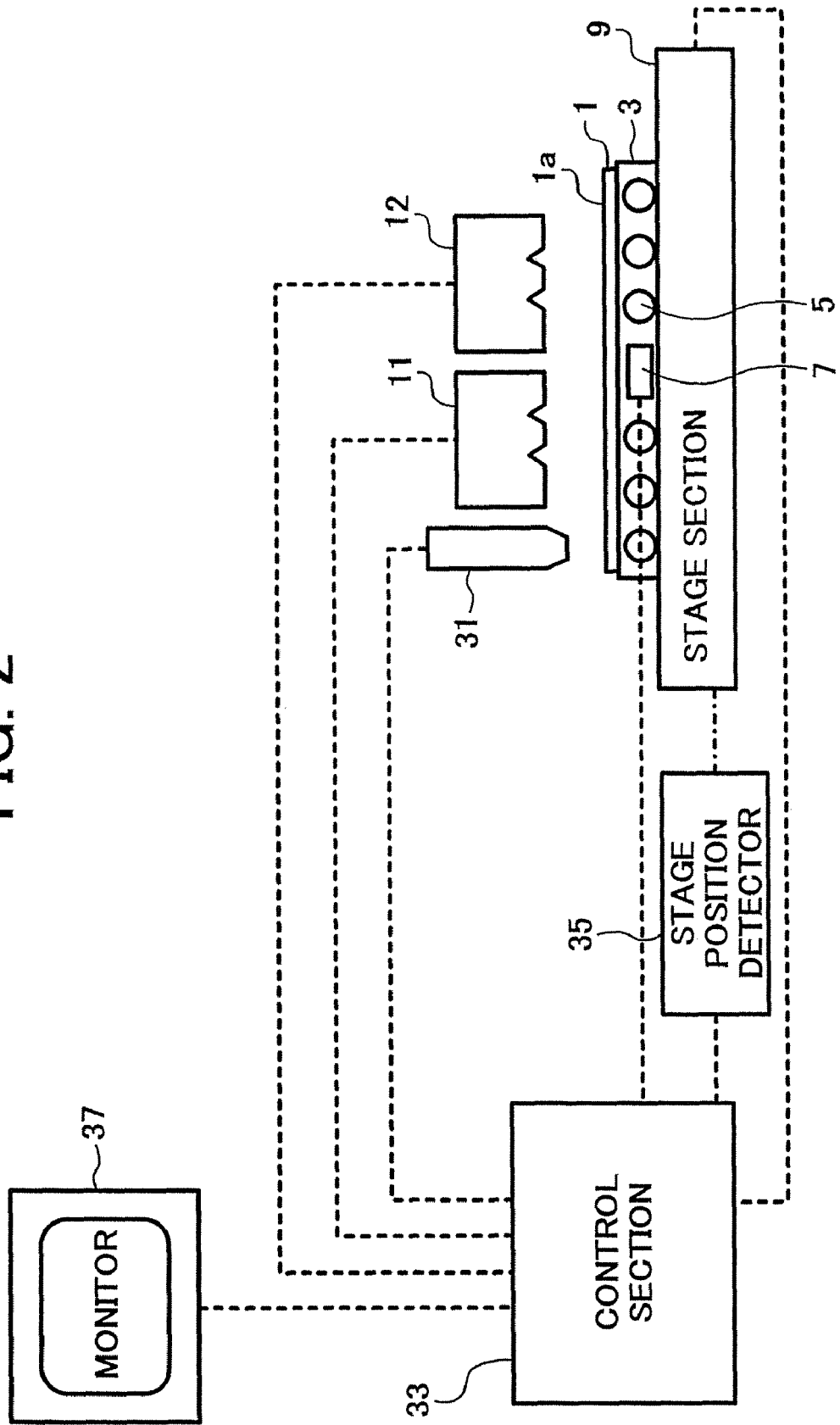
FIG. 2 is a schematic diagram illustrating a semiconductor device manufacturing apparatus according to another embodiment of the present invention.

Referring now to the drawings, wherein like reference characters designate identical or corresponding parts throughout the several figures, particularly to FIG. 2, a first embodiment is described. As shown, a substrate holding section 3 is preferably provided to hold a semiconductor wafer substrate 1 with its surface 1a facing upward. An electrically separated terminal unit (e.g., PADs) is preferably formed overlying the surface 1a and is connected to a device circuit. A small opening section (not shown) for vacuum suction use is preferably formed overlying a surface of the substrate holding section 3. The opening section is preferably connected to a vacuum apparatus (not shown) via a suction path to hold the semiconductor wafer substrate 1 on the substrate holding section 3. A heater 5 heating the semiconductor wafer substrate 1 and a temperature sensor 7 measuring a temperature of the substrate holding section 3 are preferably arranged in the substrate holding section 3. The heater 5 and temperature sensor 7 may collectively constitute a substrate temperature control mechanism in a manufacturing apparatus of a semiconductor device according to an exemplary embodiment of the present invention.

A stage section 9 is preferably arranged to support the substrate holding section 3. The stage section 9 is capable of moving the substrate holding section 3 in both horizontal and vertical directions, and rotating it in a horizontal plane, with a driving section such as a motor (not shown). The stage section 9 may constitute a driving mechanism in a manufacturing apparatus of a semiconductor device according to an exemplary embodiment of the present invention.

Above the stage section 9, a discharge head 11 discharging metal paste, an uncured plastic sealant discharge head 12 discharging uncured plastic sealant, and an image information camera 31 obtaining image information of the semiconductor wafer substrate 1 may be arranged. The discharge heads 11 and 12 may constitute a discharge mechanism in a manufacturing apparatus of a semiconductor device according to the present invention. In this preferred embodiment, the discharge heads 11 and 12 and image information camera 31 may be secured to a prescribed position.

Figure 3A:
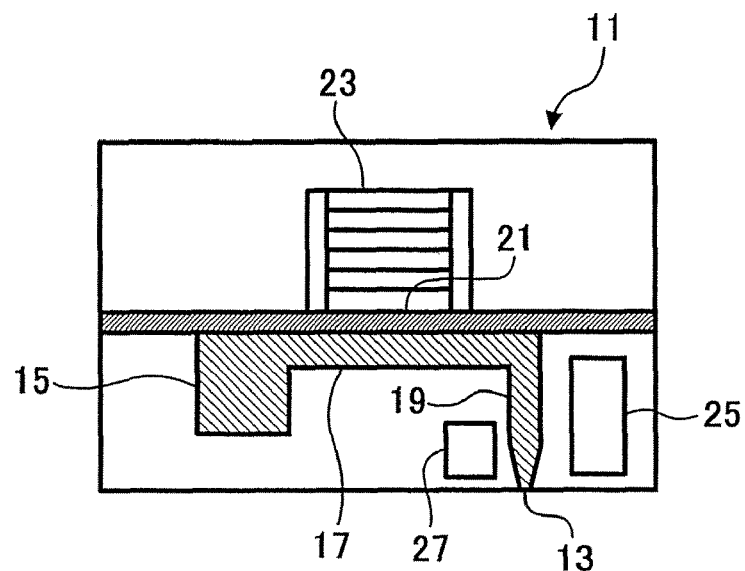
FIG. 3A is a schematic diagram illustrating a standby state of a discharge head included in the semiconductor device manufacturing apparatus of FIG. 2.
Figure 3B:
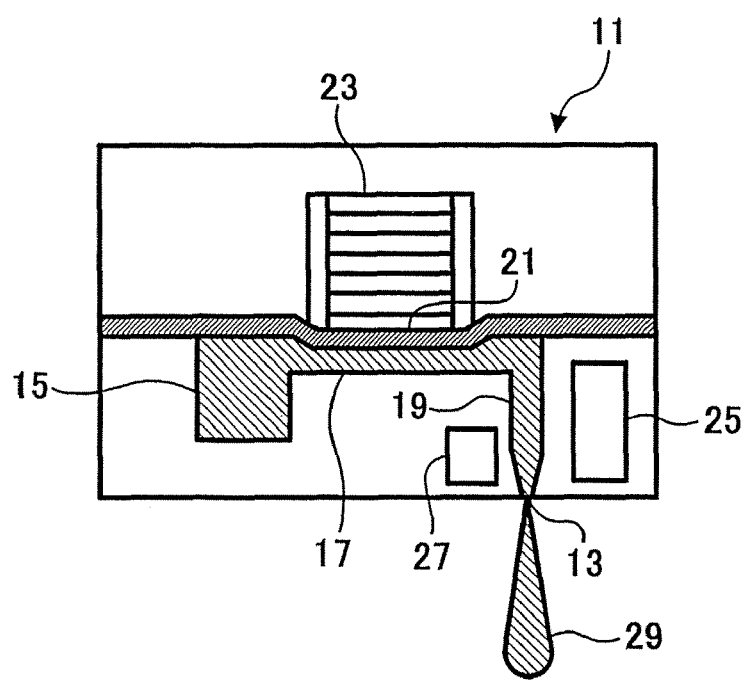
FIG. 3B is a schematic diagram illustrating an active discharge head of the semiconductor device manufacturing apparatus of FIG. 2.

Referring now to FIGS. 3A and 3B, only the discharge head 11 for metal paste use is described. The uncured plastic sealant discharge head 12 preferably has a similar construction to that of the discharge head 11.

Above the surface of the discharge head 11 opposing the semiconductor wafer substrate 1, a plurality of discharge nozzles 13 preferably is arranged in a straight line or in an array. Alternatively, only one or two discharge nozzles are utilized as illustrated in FIGS. 3 and 2, respectively. In each discharge nozzle 13, a metal paste container section 15 is preferably arranged so as to contain metal paste. In the uncured plastic sealant discharge head 12, uncured plastic sealant may be contained in the metal paste container 15.

A liquid supply path 17 and the metal paste container section 15 may be connected to a discharge nozzle 13 via a discharge vessel 19. A wall of the liquid supply path 17 may be partially formed from a flexible thin film 21. A piezoelectric element 23 may be arranged on an opposite side of the thin film 21. The discharge head 11 may further include a heater 25 heating the metal paste as well as a temperature sensor 27 measuring a temperature of the metal paste.

Operation of the discharge head 11 is now described in detail. The discharge head 11 discharges liquid drop 29 of the metal paste due to pressure generated when the piezoelectric element 23 deforms. For example, the piezoelectric element 23 preferably expands when a voltage is applied, and the liquid supply path 17 is pressed. As a result, a prescribed amount of metal paste in liquid drop 29 is discharged from the discharge nozzle 13 by the pressure as illustrated in FIG. 3B.

When the piezoelectric element 23 returns to an original position, the metal paste is drawn from the metal paste container 15 to the liquid supply path 17 as illustrated in FIG. 3A. The liquid drop of the metal paste discharged from the discharge head 11 may amount to about 0.05 nano-liters, for example. The discharge head 11 employed in this preferred embodiment may have a similar configuration to a printer head employing a piezoelectric system used in an ink jet printer.

Referring back to FIG. 2, a control section 33 may be electrically connected to and controls the stage section 9, and operates the discharge heads 11 and 12. In the vicinity of the stage section 9, a stage position detecting device 35 may be arranged to obtain positional information of the stage section 9. The control section may also be electrically connected to the temperature sensor 7, the image formation camera 31, and the stage position detecting device 35. Temperature information of the temperature sensors 7 and 27, image information of the image information camera 31, and stage position information of the stage position detecting device 35 may be transmitted to the control section 33. A monitor 37 may also be electrically connected to the control section 33 to display setting information. Further, the control section 33 accepts positional information related to a semiconductor device terminal unit to be electrically connected, in accordance with electrical characteristic evaluations such as wafer testing results and the like.

Figure 1A:
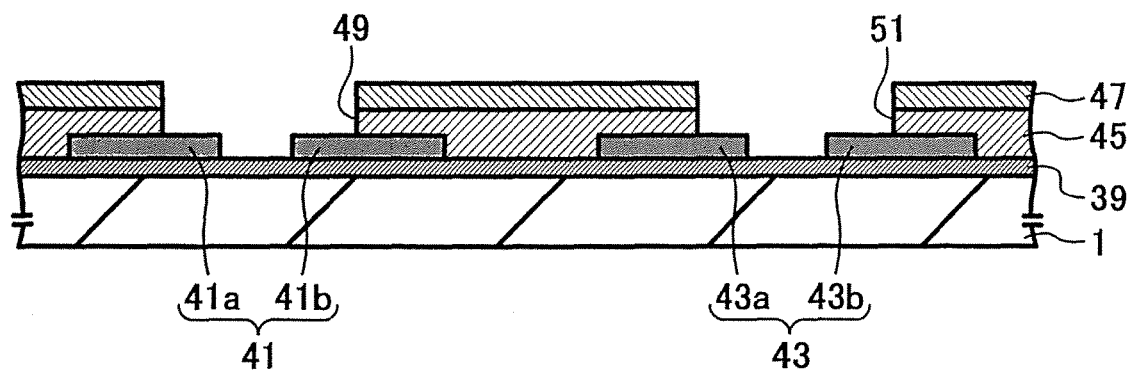
FIGS. 1A to 1D collectively illustrate a manufacturing process executing an exemplary method of manufacturing a semiconductor device according to one embodiment of the present invention.
Figure 1B:
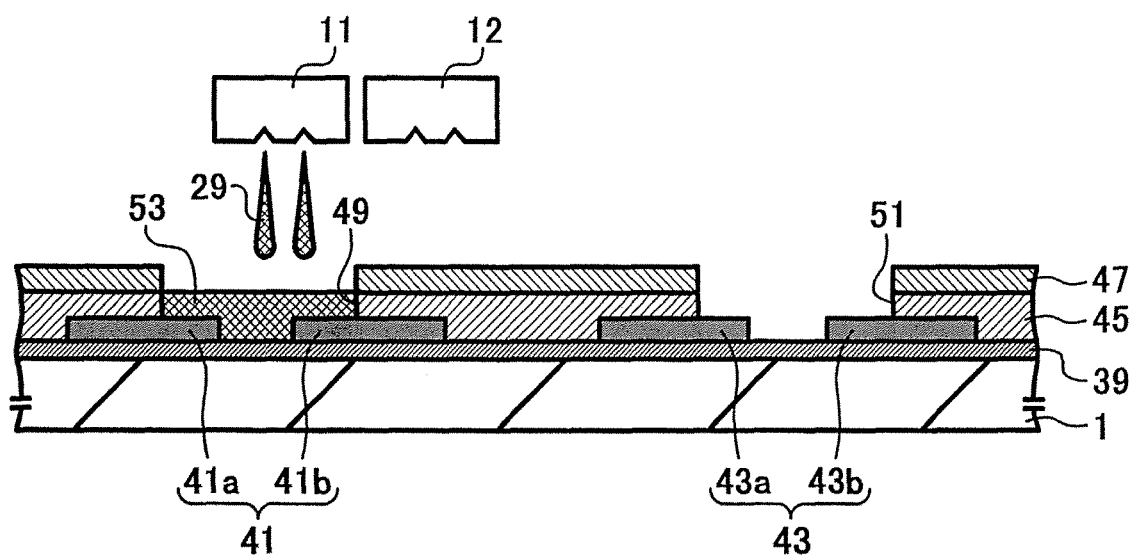
Figure 1C:
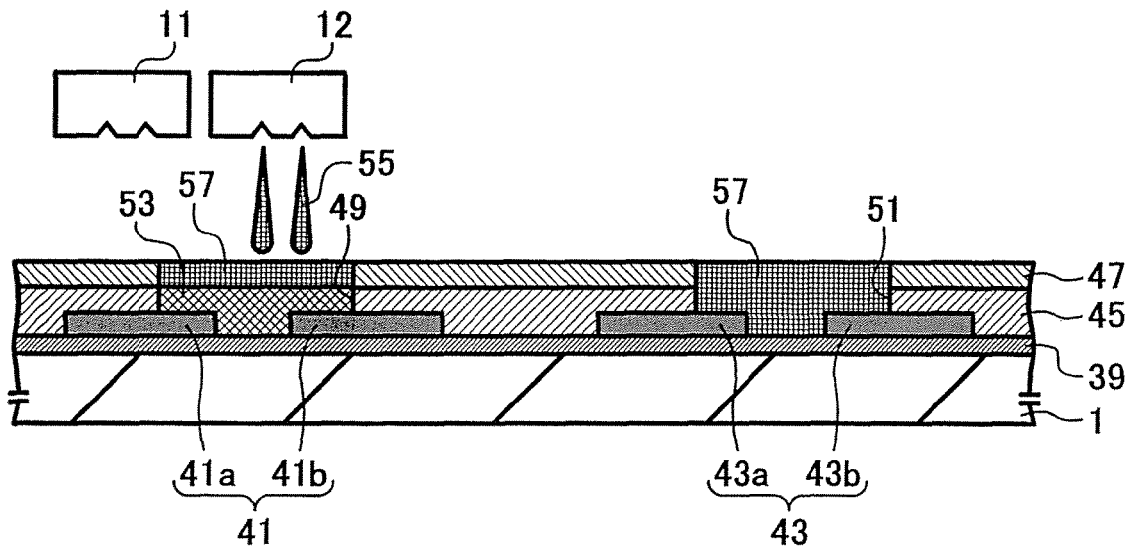

An exemplary method of manufacturing a semiconductor device and an operation of a semiconductor device manufacturing apparatus are now described with reference to FIGS. 1A to 2. As shown in FIGS. 1B and 1C, only a discharge head is illustrated in a semiconductor device manufacturing apparatus, and remaining manufacturing sections are omitted for clarity. In this preferred embodiment, a silver paste (paste solid ratio: 50 wt %) obtained by melting silver particles having a diameter of a few nanometers with solvent such as Tetradecan may be used as a metal paste. As an uncured plastic sealant, epoxy plastic liquid type sealant (CELC-3140 (produced by Hitachi Chemical Co., Ltd.)) having a viscosity of 0.6 Pa·s may be used.

First, a semiconductor wafer substrate 1 is preferably arranged on the substrate holding section 3 with its surface 1a facing upward. The substrate holding section 3 may then hold the semiconductor wafer substrate 1 using a vacuum as shown in FIG. 2.

Referring now to FIGS. 1A to 1D and 4, the semiconductor wafer substrate 1 is described in detail, in which a circuit element such as a transistor, a resistance, etc., and a wiring material and similar devices are omitted. FIGS. 1A-1D include a cross sectional view of an apparatus of FIG. 4 when viewed from the 1A-1A line of FIG. 4.

Overlying the surface 1a of the semiconductor wafer substrate 1, terminal units 41 and 43 made of polysilicon may be formed via thermal oxide film 39. The terminal unit 41 may be formed from terminals 41a and 41b arranged at a prescribed interval. The terminal unit 43 may be formed from terminals 43a and 43b arranged at a prescribed interval.

A phosphor silicate glass (PSG) film 45 may be formed overlying the terminal units 41 and 43 and thermal oxide film 39. A nitride film 47 may be formed overlying the PSG film 45 as a passivation film. The PSG and nitride films 45 and 47 may serve as an insulation layer of a semiconductor wafer substrate used in a method and apparatus for manufacturing a semiconductor device according to the present invention.

Second, opening section 49 may be formed overlying the nitride film 47 and PSG film 45 and overlapping the terminals 41a and 41b in a terminal unit 41 formation region. An opening section 51 may be formed overlying the nitride film 47 and PSG film 45 and overlapping the terminals 43a and 43b in a terminal unit 43 formation region.

The terminal units 41 and 43 may have the same construction as each other. The terminal unit 41 may be electrically connected in a post-process for example, whereas the terminal unit 43 may not be electrically connected, for example.

A thickness of the thermal oxide film 39 may be 800 nm, that of the PSG film 45, 850 nm, that of the nitride film 47, 1200 nm, and that of the polysilicon film forming the terminal units 41 and 43, 350 nm, respectively. An interval between the terminals 41a and 41b and that between the terminals 43a and 43b may range from 5 to 8 micrometers, preferably 5 micrometers. Each of the opening sections 49 and 51 may extend to 20×20 square micrometers.

A semiconductor wafer substrate is subjected to a treatment causing a wetting performance to improve with regard to metal paste and uncured plastic sealant, as described later. Treatment is applied to surface 1a, terminal units 41 and 43, and nitride film 47 Alternatively, the semiconductor wafer substrate 1 has a thin film made of material having such a wetting performance. For example, applying active species, such as ozone gas, plasma, etc., to the surface exemplifies treatments capable of improving the wetting performance. However, such a surface treatment is not crucial.

Referring back to FIGS. 2 and 3A, the control section 33 may also control the heater 25 to temperatures of metal pastes existing in the metal paste container 15 of the discharge head 11, the liquid supply path 17, and the discharge vessel 19 in accordance with temperature information transmitted from the temperature sensor 27. In addition, the control section 33 controls the heater 5 to adjust a temperature of the surface 1a of the semiconductor wafer substrate 1 in accordance with temperature information transmitted from the temperature sensor 7.

The control section 33 may control the stage section 9, and -positions the semiconductor wafer substrate 1 held by the substrate holding section 3 in accordance with image information transmitted from the image information camera 31. The control section 33 may use an image recognition technology and calculates a region of an opening section overlying a terminal unit to be electrically connected, that is, a region of the surface 1a of the semiconductor wafer substrate 1, to which a liquid drop of metal paste is adhered, in accordance with previously input positional information of the terminal unit 41 and image information of the semiconductor wafer substrate 1 transmitted from the image information camera 31.

The control section 33 may thus compare a calculation result with stage positional information transmitted from a stage positional detector 35, and transmits a driving signal to the stage section 9 and the discharge head 11 in accordance with the calculation result. The control section 33 may then control the substrate holding section 3 holding the semiconductor wafer substrate 1 to appropriately position the substrate to receive the below described discharge. The control section 33 may simultaneously discharge the liquid drop 29 of the metal paste in an appropriate amount from the discharge head 11, and coats a prescribed opening section 49 formed overlying the terminal unit 41 to be electrically connected with the metal paste 29. Thereby, a metal wiring layer 53 may be formed and the terminals 41a and 41b are electrically connected. The opening section 49 is preferably coated with a prescribed amount of the metal paste so that a film thickness of the metal wiring layer 53 is about 1350 nm overlying the thermal oxide film 39 and that of the metal wiring layer 53 is about 1000 nm overlying the terminals 41a and 41b as illustrated in FIG. 1B.

The thickness of the metal wiring layer 53 is not limited to the above-mentioned levels, and a thinner metal wiring layer 53 may be employable, sufficient to provide an allowable current density. Further, since a volume of the liquid drop 29 of the metal paste discharged from the discharge head 11 can be precisely adjusted to a 5 pico-liter level at the least, for example, a plastic amount of the liquid drop 29 applied to a surface can be adjusted to a level achieving a precision of a few micrometers, for example, as required at a boundary of the edge of the opening section 49.

Third, the control section 33 may use an image recognition technology and calculates therewith a region of the surface 1a of the semiconductor wafer substrate 1, to which a liquid drop of uncured plastic sealant is adhered, in accordance with previously input positional information of both of the opening sections 49 and 51 and image information of the semiconductor wafer substrate 1 transmitted from the image information camera 31.

The control section 33 may then compare the previously input positional information with stage positional information transmitted from the stage positional detector 35, and transmits a driving signal to the stage section 9 and the discharge head 11. The control section 33 may subsequently position the substrate holding section 3 holding the semiconductor wafer substrate 1. The control section 33 then discharges the liquid drop 55 of the uncured plastic sealant in an appropriate amount from the discharge head 12, and fills in an opening section 49 in order to form the metal wiring layer 53, and an opening section 51 in which the metal wiring layer 53 is not formed. Thereby, an uncured plastic sealant layer 57 is formed. The uncured plastic sealant layer 57 preferably has a film thickness of about 700 nm on the metal wiring layer 53 in the opening section 49, about 2050 nm overlaying the thermal oxide film 39 in the opening section 51, and about 1700 nm overlaying the terminals 43a and 43b, respectively, as illustrated in FIG. 1C.

In this preferred embodiment, an upper surface of the uncured plastic sealant layer 57 is formed at the same level as that of the nitride film 47. However, the present invention is not limited thereto. Specifically, the thickness of the uncured plastic sealant layer 57 can be thinner or thicker, and can run over in the vicinity of the opening sections 49 and 51 so that the opening sections 49 and 51 can be sealed after the uncured plastic sealant layer 57 is cured and penetration of moisture or the like can be prevented.

Since a volume of liquid drop 55 of the uncured plastic sealant discharged from the discharge head 12 can be precisely adjusted at least to about five pico-liters, for example, when a prescribed precision is necessitated at a boundary of an edge of the opening sections 49 and 51, the liquid drop volume can be adjusted to achieve a precision of a few micrometers, for example.

Fourth, the semiconductor wafer substrate 1 may be removed from the substrate holding section 3. The semiconductor wafer substrate 1 may then be subjected to a heat processing operation for thirty minutes at a temperature of 120° centigrade, for example.

Figure 1D:
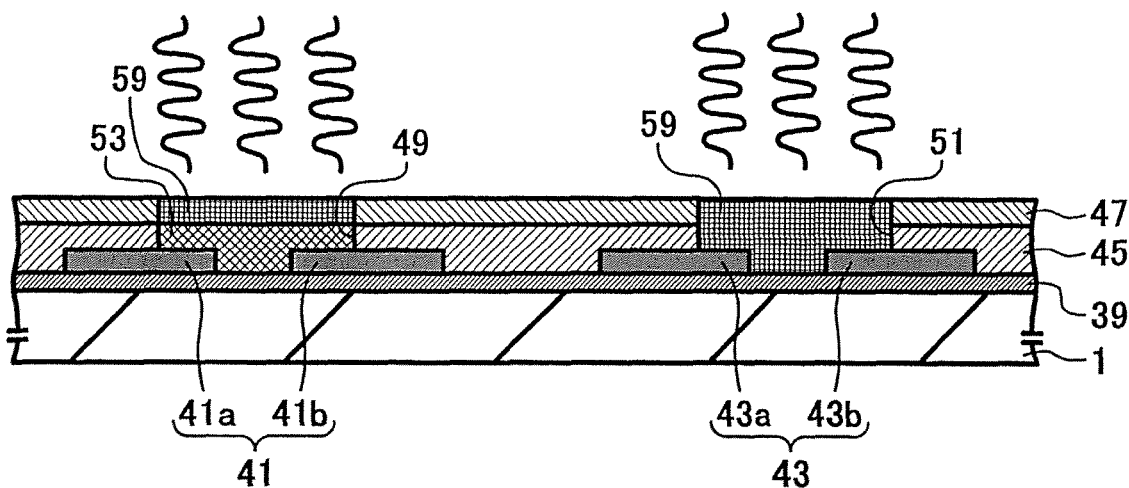

The semiconductor wafer substrate 1 may further receive a heat processing operation for sixty minutes at a temperature of 250° centigrade so as to stabilize the metal wiring layer 53, and simultaneously cure the uncured plastic sealant layer 57 in order to form a plastic sealant layer 59 as illustrated in FIG. 1D.

In this way, according to the above-described preferred embodiment, the opening section 49 formed overlying the terminal unit 41 to be electrically connected may be coated with the metal paste, selectively, and thereby the terminals 41a and 41b can be electrically connected. Thus, without using an expensive laser trimming apparatus, a connection condition of an electrical circuit formed the semiconductor device can be determined, and a relatively expensive maintenance cost for maintaining a laser trimming apparatus and accordingly a manufacturing cost can be reduced.

Figure 5:
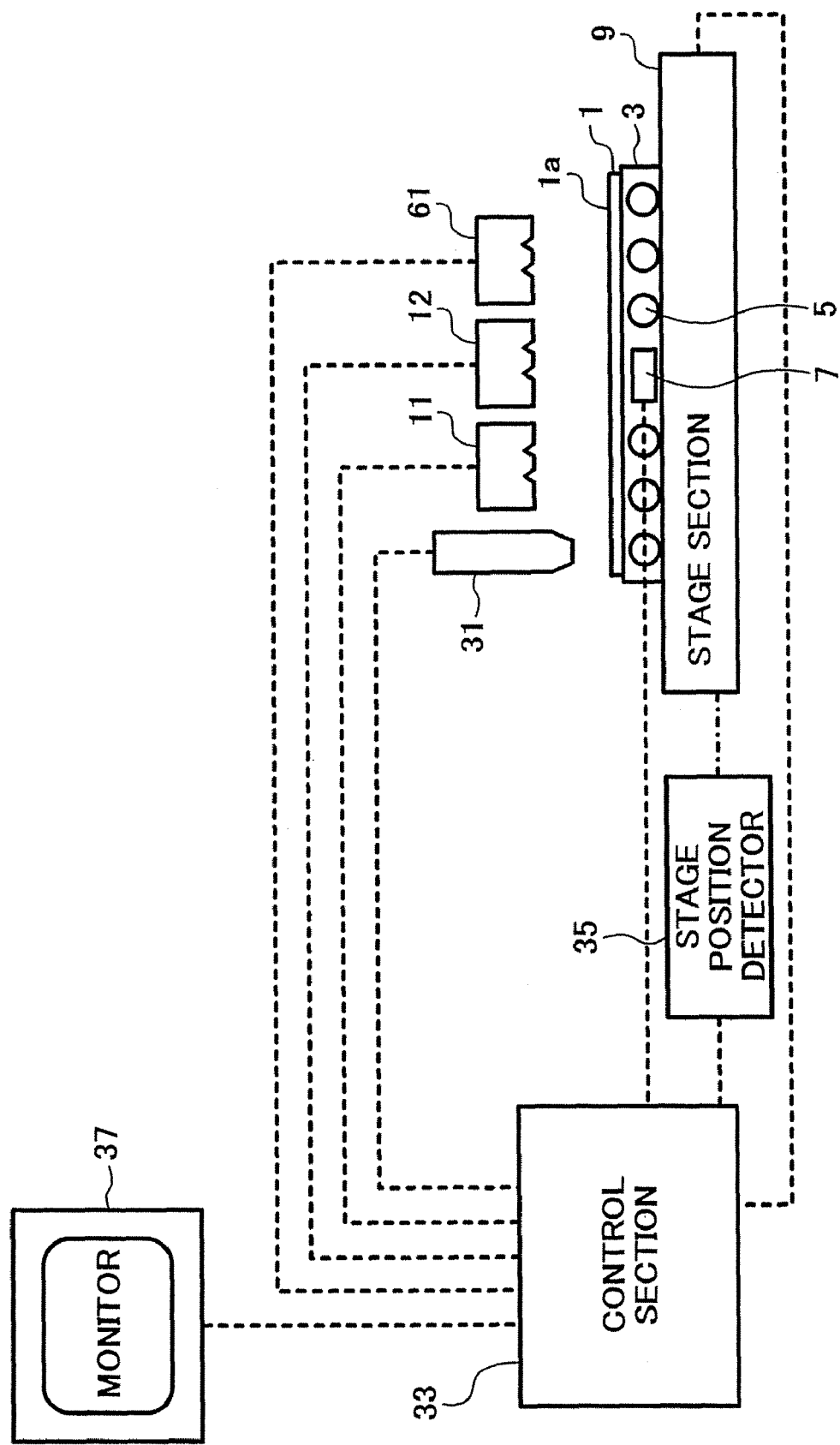
FIG. 5 illustrates an exemplary semiconductor device manufacturing apparatus according to still another embodiment of the present invention.

Another type of semiconductor manufacturing apparatus is now described with reference to FIG. 5.

As shown, above a stage section 9, a pair of discharge heads 11 and 12, as well as a discharge head 61 capable of discharging a different amount of metal paste in a liquid drop from that of the discharge head 11, are preferably arranged. A position of the discharge head 61 may be fixed. A configuration of the discharge head 61 may be similar to that of the discharge head 11 and discharges a metal paste volume of 100 nano liters, for example. A control section 33 may control the discharge head 61.

Figure 6A:
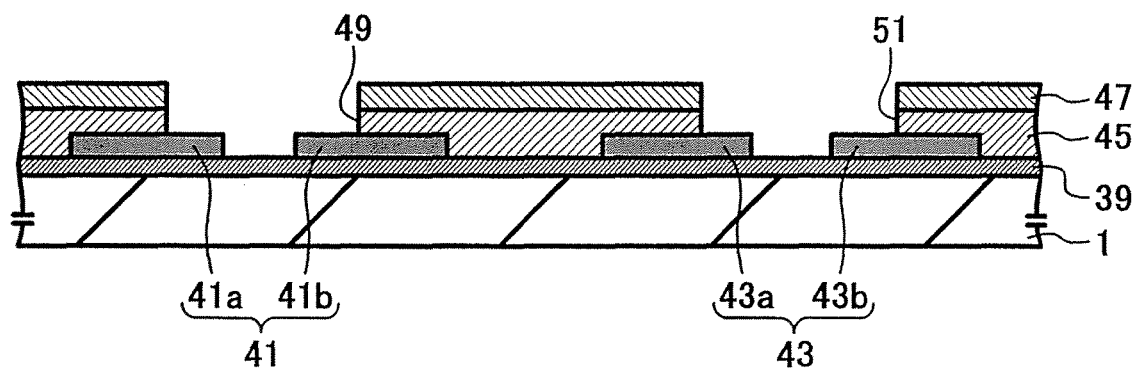
FIGS. 6A to 6D are process diagrams collectively illustrating an exemplary semiconductor device manufacturing method according to still another embodiment of the present invention.
Figure 6B:
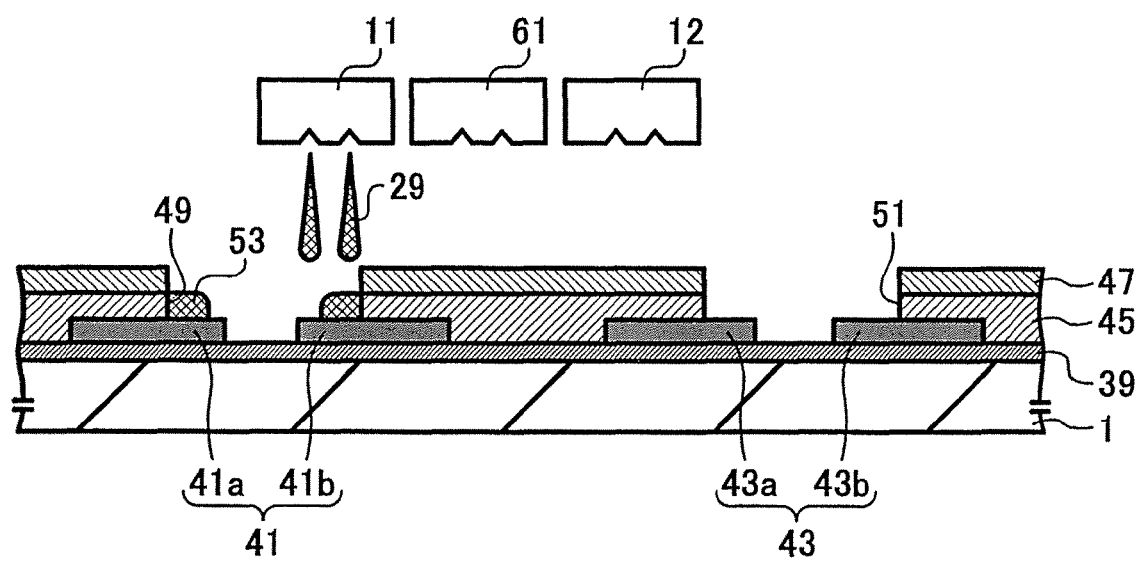

Referring now to FIGS. 5 and 6A-6D, an exemplary semiconductor device manufacturing method and apparatus are described in which a semiconductor device manufacturing apparatus similar to that described with reference to FIG. 4 is employed and FIGS. 6A and 6B only illustrate discharge heads 11, 12, and 61 and omit remaining manufacturing devices for clarity.

First, terminal units 41 and 43 are preferably formed overlying a surface 1a via a thermal oxide film 39. A semiconductor wafer substrate 1 is arranged overlying a substrate holding section 3 with its surface 1a facing upward as illustrated in FIG. 6A. A PSG film 45 and a nitride film 47 formed overlying the semiconductor wafer substrate 1 may have opening sections 49 and 51 overlying the terminals 41 and 43, respectively.

Second, the control section 33 may calculate a region of the surface 1a, overlying the semiconductor wafer substrate 1, to which a liquid drop of the metal paste is to be adhered. Then, the control section 33 may control the discharge heads 11, 12, 61, and the stage section 9 to operate and start discharging metal paste to the surface 1a. In the vicinity of the edge of the opening section 49 overlying the terminal unit 41 to be electrically connected, for example, a frame state region having a width of five micrometers from the edge of the opening section 49, a metal wiring layer 53 may be formed using a discharge head 11 discharging a smaller liquid drop of the metal paste than that discharged by the discharge head 61. Thus, the boundary can be precisely formed with the metal paste 49 in the vicinity of the edge of the opening section 49 as illustrated in FIG. 6B.

Figure 6C:
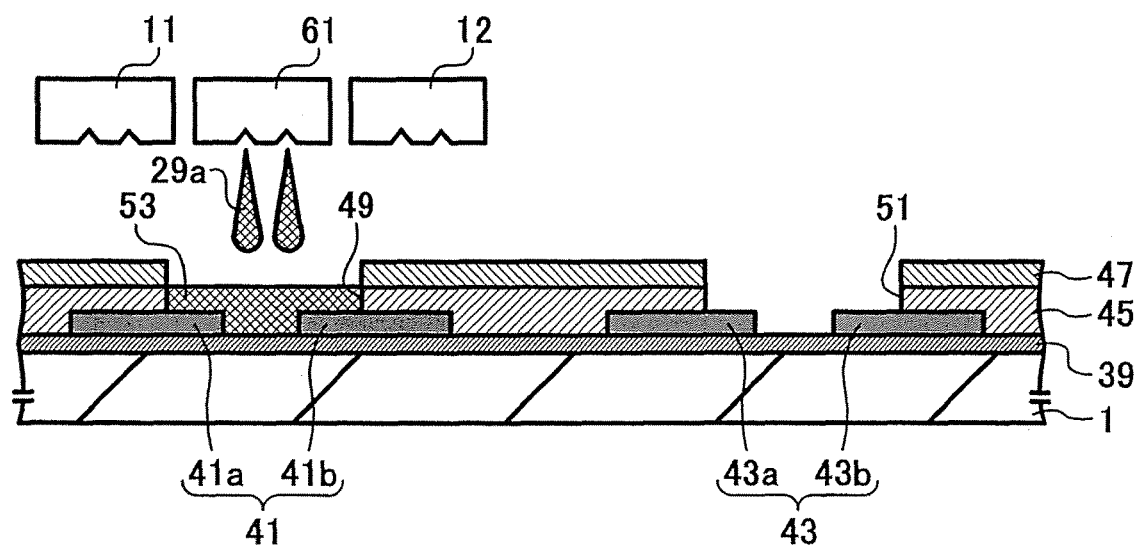

By contrast, in the central region other than the vicinity of the opening section 49, the metal wiring layer 53 may be formed using the discharge head 61 discharging the liquid drop 29a having a greater volume of metal paste than that discharged by the discharge head 11, and the terminals 41a and 41b may be electrically connected, as illustrated in FIG. 6C. Thus, throughput can be improved in comparison to when the metal wiring layer 53 is formed only using the discharge head 11 discharging a smaller liquid drop.

Figure 6D:
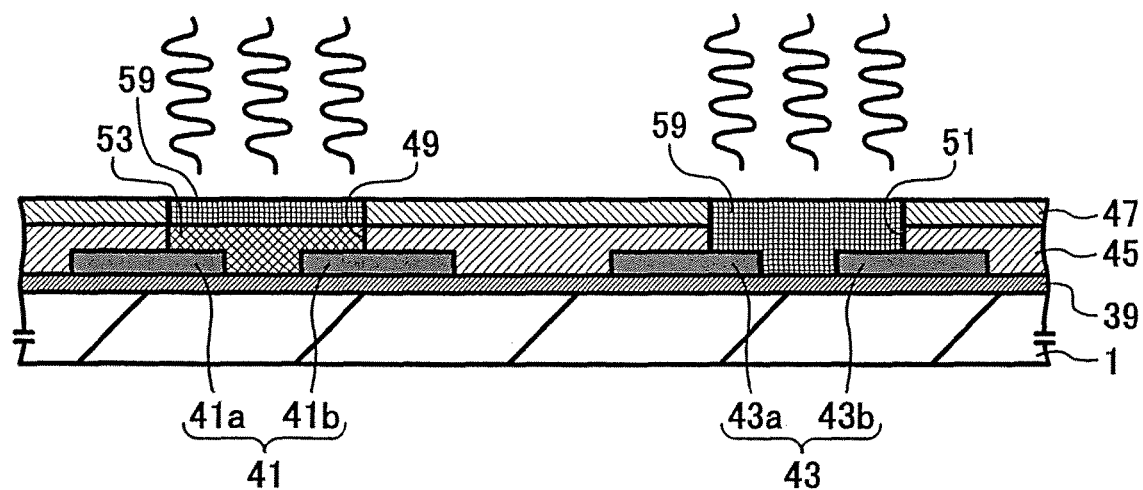

After that, similar to the manufacturing process mentioned earlier with reference to FIG. 1C, an uncured plastic sealant layer may be formed using the discharge head 12 in the opening sections 49 and 51. Then, the semiconductor wafer substrate 1 may be removed from the substrate holding section 3. Similar to the manufacturing process as described earlier with reference to FIG. 1D, the metal wiring layer 53 and the uncured plastic sealant layer may then be cured in order to stabilize the metal wiring layer 53 and form a plastic sealant layer 59 as illustrated in FIG. 6D.

According to this preferred embodiment, the manufacturing process includes selectively using one of the discharge heads 11 and 61, each discharging a different size of liquid drop in appropriate amounts in accordance with a region of an opening section 49 receiving metal paste. The boundary can be precisely formed with the metal wiring layer 53 in the vicinity of the edge of the opening section 49. Further, throughput can be improved in comparison to a case when the metal wiring layer 53 is formed only using the discharge head 11 discharging a smaller volume of each liquid drop.

Thus, in this preferred embodiment, after the metal wiring layer 53 is formed using the discharge head 11 in the vicinity of the edge of the opening section 49, the metal wiring layer 53 is formed over the entire opening section 49 by using the discharge head 61 and coating the central region of the opening section 49 with the metal paste. However, the present invention is not limited thereto and a central region can be coated with metal paste before a region in the vicinity of an edge of the opening section 49. Further, the central region and the region in the vicinity of the edge can be coated in a scanning direction of the discharge heads 11 and 61.

Further, even in this preferred embodiment, only the discharge head 12 is utilized in forming the uncured plastic sealant layer. The present invention is not so limited. Specifically, similar to the method forming the metal wiring layer 53, more than two types of discharge heads, each discharging a different amount of uncured plastic sealant, can be used to form a uncured plastic sealant layer, and the boundary can be precisely formed with the uncured plastic sealant layer and the plastic sealant layer 59. Further, throughput can be improved in comparison to a case when the uncured plastic sealant layer is formed only by the uncured plastic sealant using a discharge head discharging a smaller volume of the liquid drop.

In this preferred embodiment, polysilicon is employed as material of the terminals 41a, 41b, 43a, and 43b forming the terminal units, though the present invention is not limited thereto. Specifically, other conductive materials such as aluminum, copper, etc., are employable.

Further, even though in the above-described preferred embodiment, a terminal unit formed from two terminals is exemplified as a semiconductor wafer substrate to which the semiconductor device manufacturing apparatus and method of the present invention is applied, the present invention is not limited thereto. That is, a number of terminals forming the terminal unit can be three or more.

Figure 7:
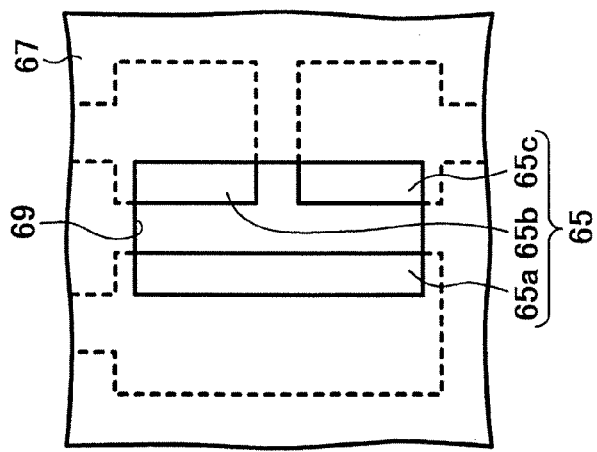
FIG. 7 is a plan view illustrating exemplary terminal units formed overlying a semiconductor wafer substrate, to which apparatus and methods of manufacturing a semiconductor device of the present invention are applied.

For example, as illustrated in FIG. 7, three terminals 65a, 65b, and 65c are preferably employed, and an opening section 69 is preferably arranged on an insulation layer 67 serving as a passivation layer overlying the terminals 65a, 65b, and 65c.

Figures 8A, 8B:
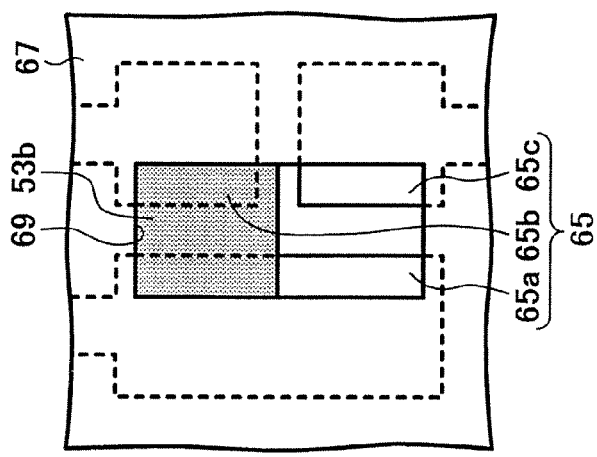
FIG. 8A illustrates an exemplary application of the present invention in which terminals to be electrically connected are selected among at least three terminals constituting a terminal unit by selecting a region to which a metal paste is adhered in an opening thereby differentiating formation regions of a metal wiring layer, and in which all the terminals are electrically connected.
FIG. 8B illustrates another exemplary application of the present invention in which terminals to be electrically connected are selected among at least three terminals constituting a terminal unit by selecting a region to which a metal paste is adhered in an opening thereby differentiating formation regions of a metal wiring layer, and in which only selected terminals are electrically connected.

When three or more terminals are employed as a terminal unit, prescribed terminals can be partially or entirely connected electrically with metal paste. For example, as illustrated in FIGS. 8A and 8B, when three terminals 65a, 65b, and 65*c* are employed as a terminal unit 65, and an opening section 69 is preferably arranged on an insulation layer 67 overlying the terminals 65*a*, 65*b*, and 65*c*, a metal wiring layer 53*a* is formed in the entire region of the opening section 69 and thereby the terminals 65*a*, 65*b*, and 65*c* are electrically connected as shown in FIG. 8A. Otherwise, as shown in FIG. 8B, a metal wiring layer 53*b* is partially formed in the region of the opening section 69, and the terminals 65*a* and 65*b* can be electrically connected as shown in FIG. 8B.

Figure 9:
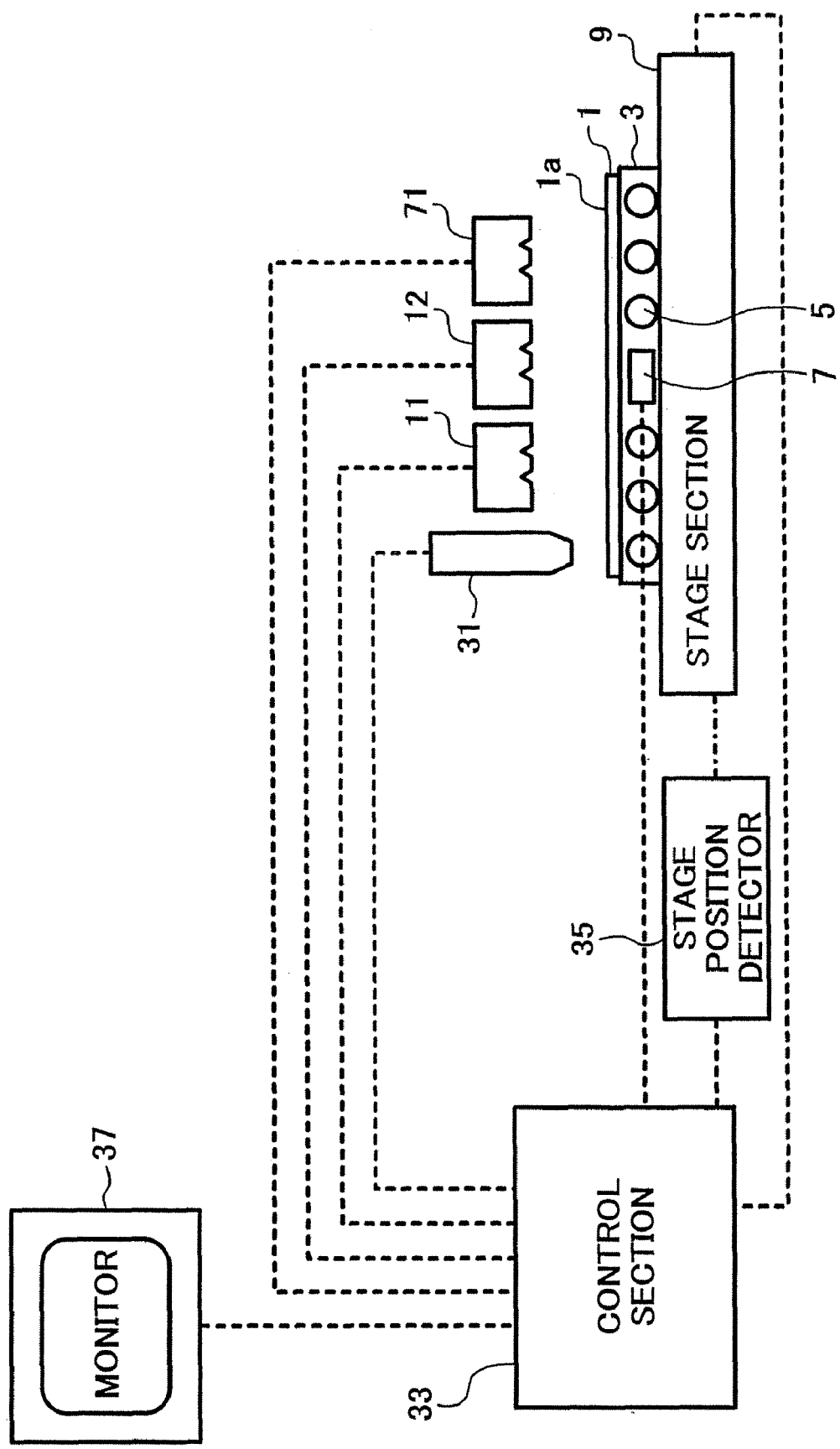
FIG. 9 is a schematic diagram illustrating an exemplary semiconductor device manufacturing apparatus of still another embodiment of the present invention.

Referring now to FIG. 9, still another exemplary semiconductor device manufacturing apparatus of the present invention is described. As shown, above a stage section 9, a pair of discharge heads 11 and 12 is preferably disposed. A discharge head 11 may contain metal paste having a first electric resistance. A discharge head 71 may contain metal paste having a second electric resistance that is different from the first electric resistance. The position of discharge head 71 may be fixed. A configuration of the discharge head 71 may be similar to that of the discharge head 11. A control section 33 may control the discharge head 71. Ways of differentiating electric resistances of the metal paste can be as follows: First, metal material themselves are differentiated. Diameters of metal fine particles in the metal paste are differentiated. Otherwise, solutions may be differentiated.

Figure 10A:
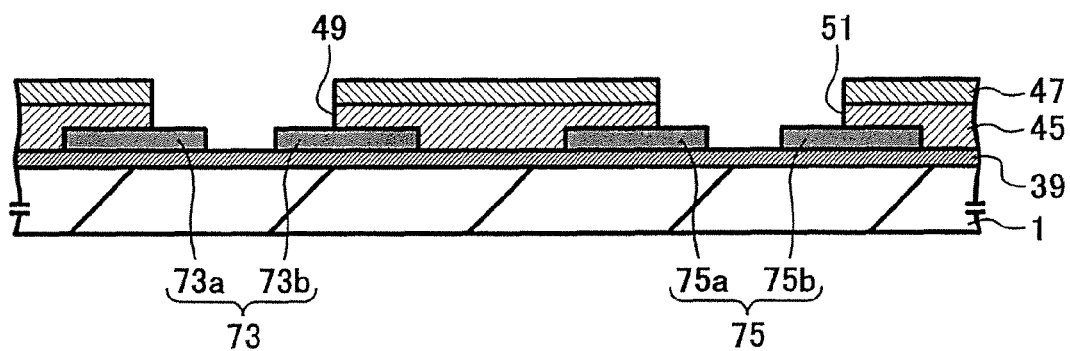
FIGS. 10A to 10D are process diagrams collectively illustrating an exemplary semiconductor device manufacturing apparatus of still another embodiment of the present invention.
Figure 10B:
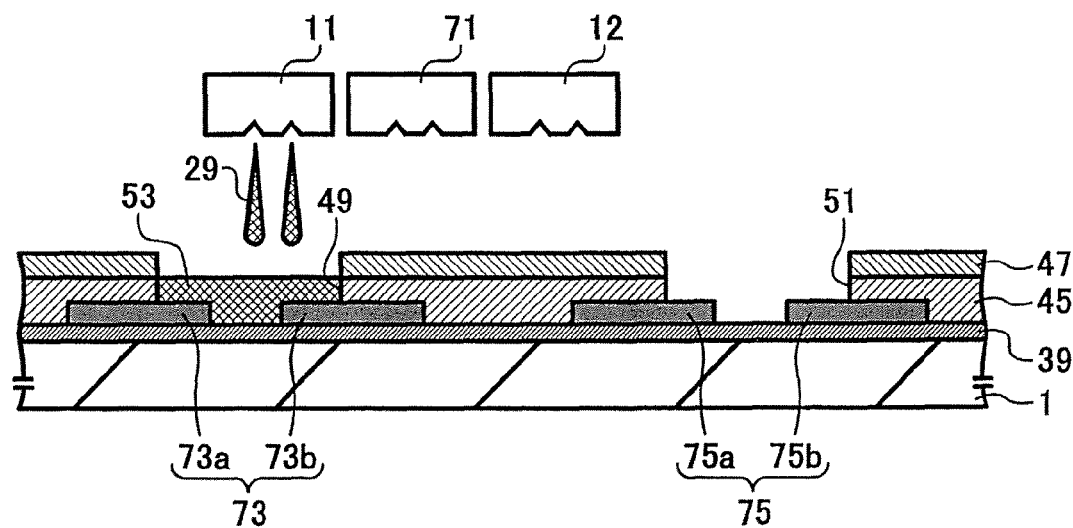
Figure 10C:
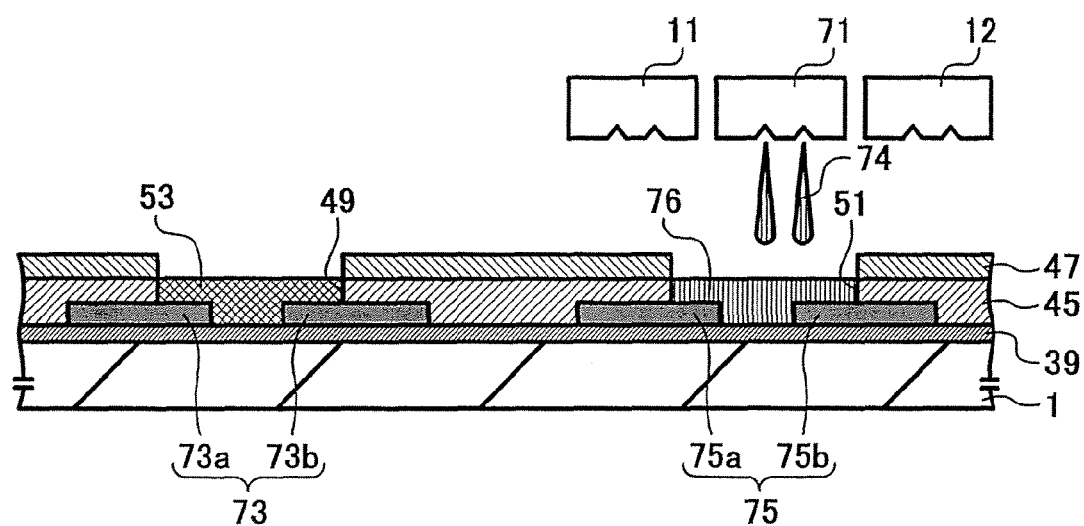
Figure 10D:
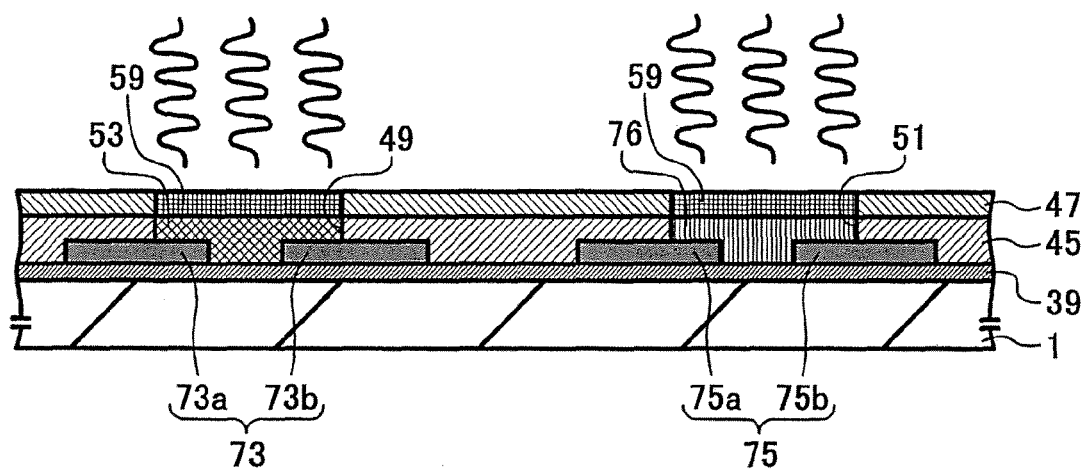

Referring now to FIGS. 9 to 10D, still another exemplary semiconductor device manufacturing apparatus is now described, in which a semiconductor device manufacturing apparatus similar to that illustrated in FIG. 9 is employed. Only discharge heads 11, 12, and 71 are illustrated and remaining manufacturing devices are omitted in FIGS. 10B and 10C for clarity.

First, terminal units 73 and 75 are preferably formed overlying a surface 1*a* of a semiconductor wafer substrate 1 via a thermo oxide film 39. A PSG film 45 and a nitride film 47 having opening sections 49 and 51 may be formed overlying the semiconductor wafer substrate 1 overlying the terminals 73 and 75, respectively. The semiconductor wafer substrate 1 may be set on a substrate holding section 3 with its surface 1*a* facing upward as illustrated in FIG. 9. The terminal unit 73 formed from terminals 73*a* and 73*b* may be electrically connected with metal paste having the first electric resistance. The terminal unit 75 formed from the terminals 75*a* and 75*b* may be electrically connected with metal paste having the second electric resistance.

The control section 33 may calculate a region of the surface 1*a* on the semiconductor wafer substrate 1, to which liquid drops of the first metal paste and the second metal paste are adhered. Subsequently, the control section 33 may control the discharge heads 11, 12, and 71 and the stage section 9 to operate and start discharging the first metal paste and the second metal paste to the surface 1*a* of the semiconductor wafer substrate 1. A metal wiring layer 53 having the first electric resistance may be formed in the opening section 49 using the discharge head 11 discharging the metal paste 29 having the first metal resistance as illustrated in FIG. 10B.

A metal wiring layer 76 having the second electric resistance may be formed in the opening section 51 using the discharge head 71 discharging the metal paste 74 having the second metal resistance as illustrated in FIG. 10C.

Similar to the third and fourth manufacturing processes described earlier with reference to FIGS. 1C and 1D, after the uncured plastic sealant layer is formed in the opening sections 49 and 51 using the discharge head 12, the semiconductor wafer substrate 1 may be removed from the substrate holding section 3. Then, the metal wiring layers 53 and 76 and the uncured plastic sealant layer may be cured so as to stabilize the metal wiring layers 53 and 76, and form a plastic sealant layer 59 as illustrated in FIG. 10D.

According to this preferred embodiment, by differentiating types of metal paste to be coated in the opening sections 49 and 51, a resistance between the terminals 73*a* and 73*b* electrically connected by the metal wiring layer 53 having the first electric resistance and that between the terminals 75*a* and 75*b* electrically connected by the metal wiring layer 76 having the second electric resistance can be different. In this way, a resistance between terminals to be electrically connected can be determined by selecting a type of metal paste to be coated in an opening section.

Figure 11A:
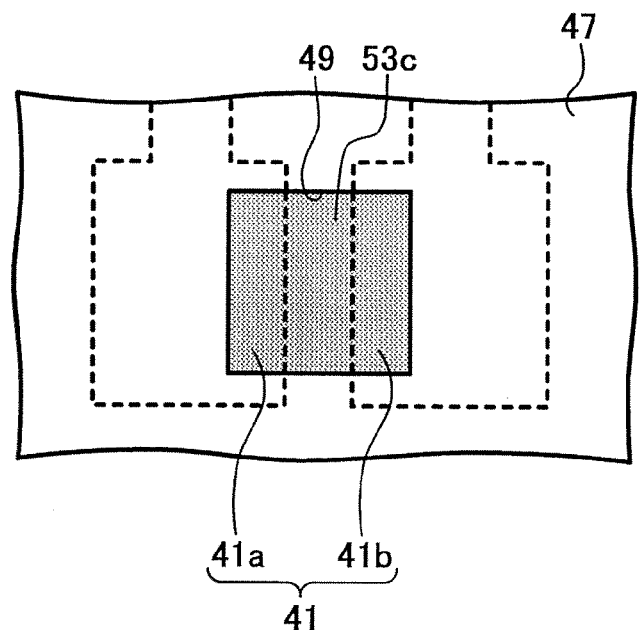
FIG. 11A is a plan view illustrating an exemplary semiconductor wafer substrate, in which a resistance value between terminals is determined by selecting a region to which metal paste is adhered and thereby differentiating formation regions of a metal wiring layer in an opening, and in which the metal wiring layer is formed in the entire region of the opening.
Figure 11B:
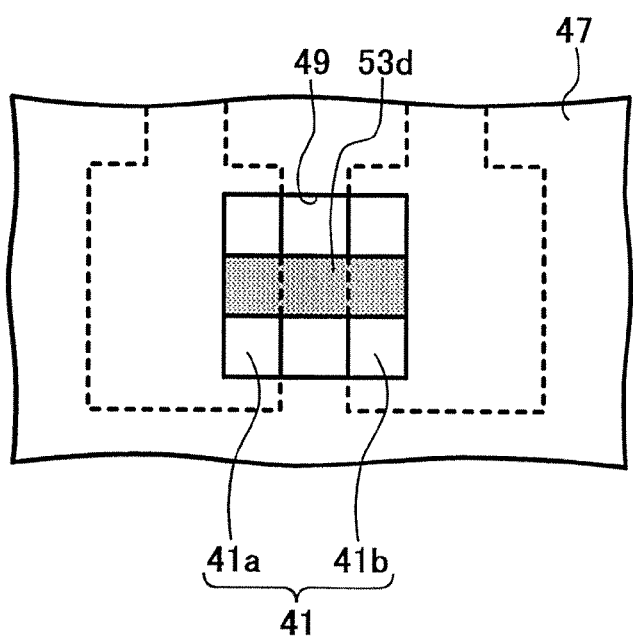
FIG. 11B is a plan view illustrating an exemplary semiconductor wafer substrate, in which a resistance value between terminals is determined by selecting a region to which metal paste is adhered thereby differentiating formation regions of a metal wiring layer in an opening, and in which the metal wiring layer is partially formed in the regions of the opening.

Alternatively, a resistance between terminals can be determined as illustrated in FIGS. 11A and 11B. Specifically, a region to which metal paste is adhered may be selected and a metal wiring layer 53*c* is preferably formed in the entire region in the opening section 49, but a line width (the vertical direction in FIG. 11A) of a metal wiring layer between the terminals 41*a* and 41*b* may be increased as illustrated in FIG. 11A, thereby a resistance there between can be determined. Otherwise, a metal wiring layer 53*d* is partially formed in the opening section 49, and the line width of the metal wiring layer between the terminals 41*a* and 41*b* is decreased as illustrated in FIG. 11B.

Figure 12A:
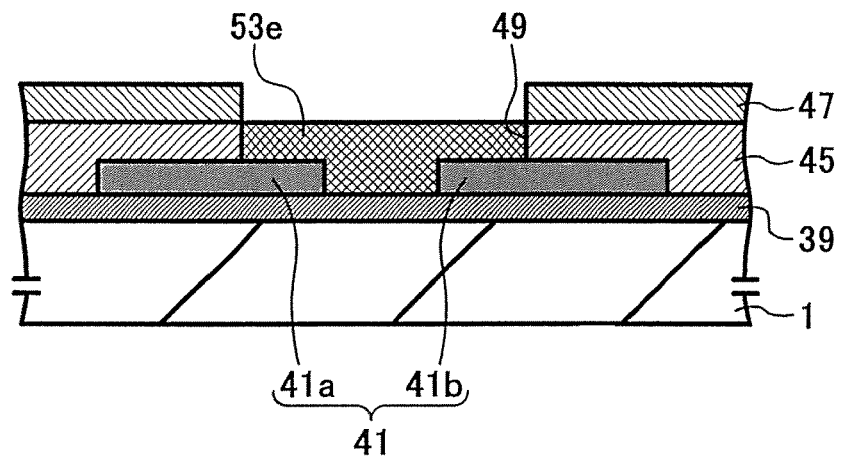
FIG. 12A is a cross sectional view illustrating an exemplary semiconductor wafer substrate, in which a resistance value between terminals is determined by differentiating metal wiring layers with regard to a film thickness in an opening by adjusting an amount of metal paste to be adhered, and in which a thicker metal wiring layer is formed.
Figure 12B:
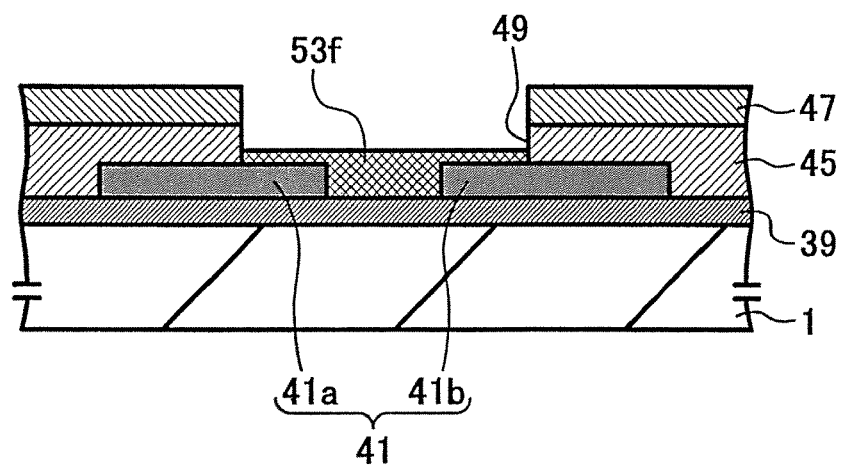
FIG. 12B is a cross sectional view illustrating an exemplary semiconductor wafer substrate, in which a resistance value between terminals is determined by differentiating metal wiring layers with regard to a film thickness in an opening by adjusting an amount of metal paste to be adhered, and in which a thinner metal wiring layer is formed.

As still another method of determining a resistance between terminals 41*a* and 41*b*, a thickness of a metal paste layer applied to a prescribed region may be adjusted, i.e., a thick metal wiring layer 53*e* may be formed in the opening section 49 illustrated in FIG. 12, and a thin metal wiring layer 53*f* may be formed in the opening section 49 illustrated in FIG. 12. Further, by choosing a type, a film thickness, and a line width of metal paste to be coated to an opening section, or combining these parameters, a resistance between terminals can be determined.

Figure 13:
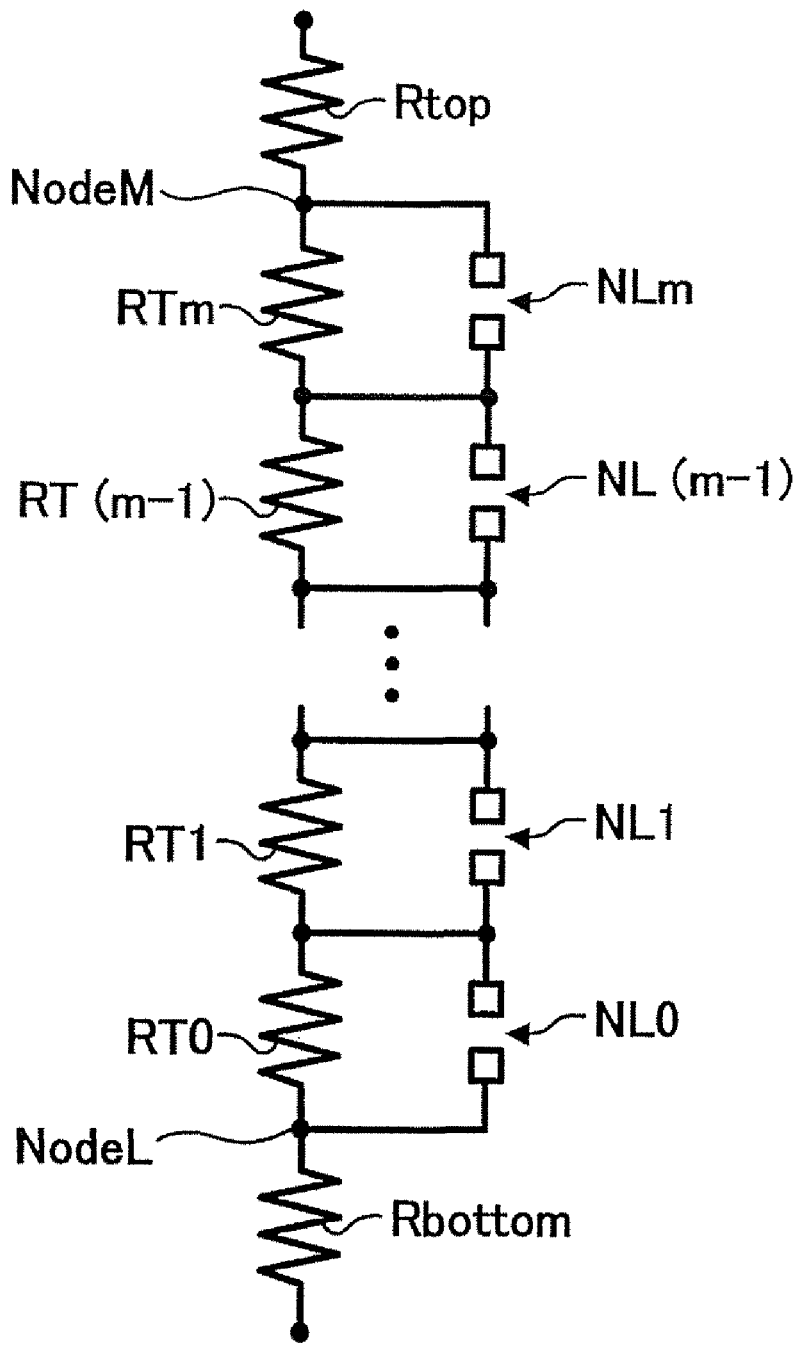
FIG. 13 is a chart illustrating a division resistance as an exemplary electronic circuit in which a connection condition can be determined by selectively connecting or disconnecting a terminal unit.

Referring now to FIG. 13, an exemplary resistance circuit capable of determining a circuit connection condition by selectively connecting and disconnecting terminals collectively forming a terminal unit is illustrated as one example of an electric circuit.

As shown, a resistance element Rbottom, m+1 items of resistance elements RT0 to RTm, and a resistance element Rtop may be serially connected, wherein "m" represents a positive integer. To the resistance elements RT0 to Rtm, terminal units N0 to Nm are preferably connected in parallel, respectively. Each of the terminal units may be formed from a pair of terminals not electrically connected to each other.

Figure 14:
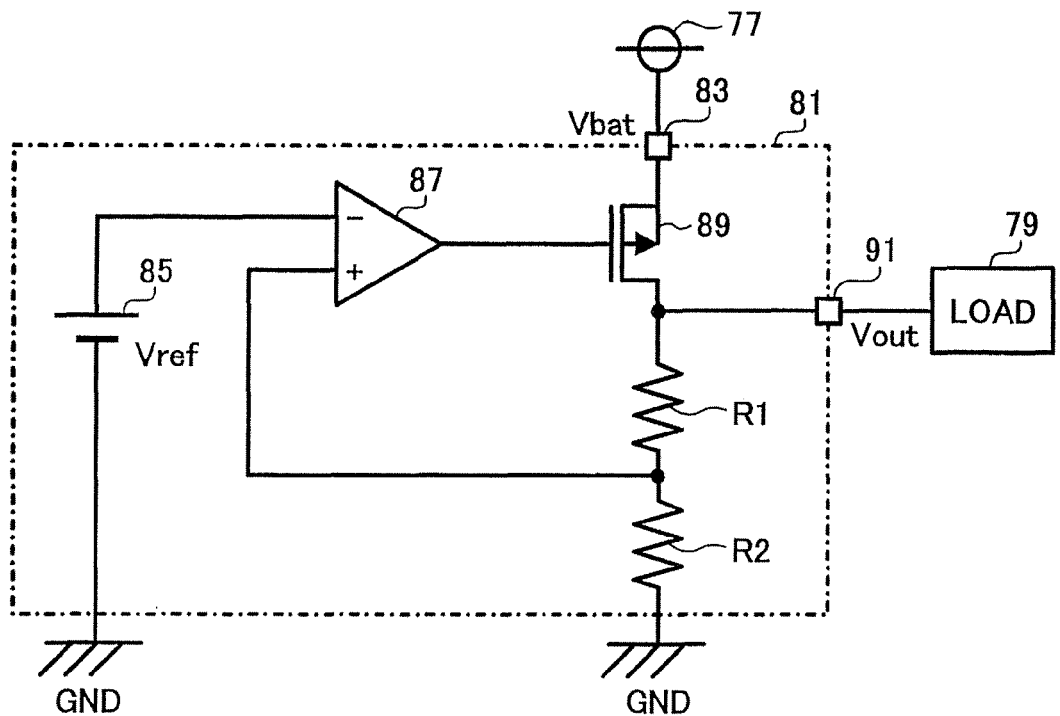
FIG. 14 is a chart illustrating an exemplary circuit of a semiconductor device employing a constant voltage generation circuit.
Figure 15:
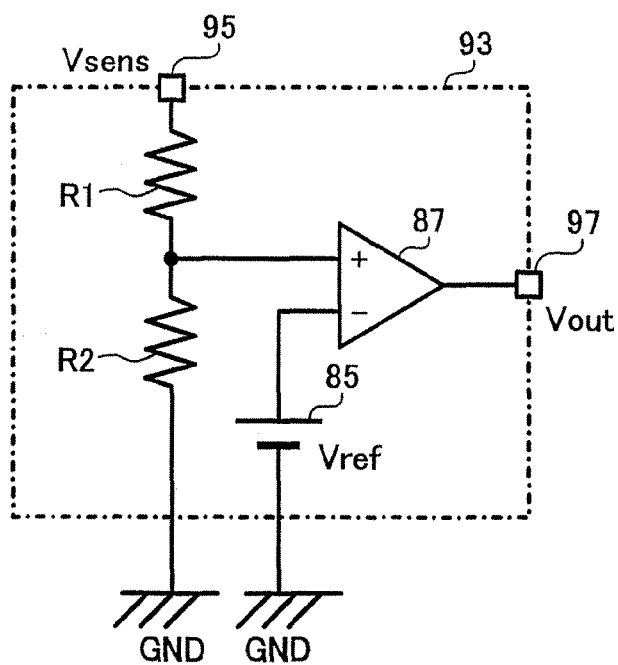
FIG. 15 illustrates an exemplary circuit formed in a semiconductor device having a voltage detection circuit.
Figure 16:
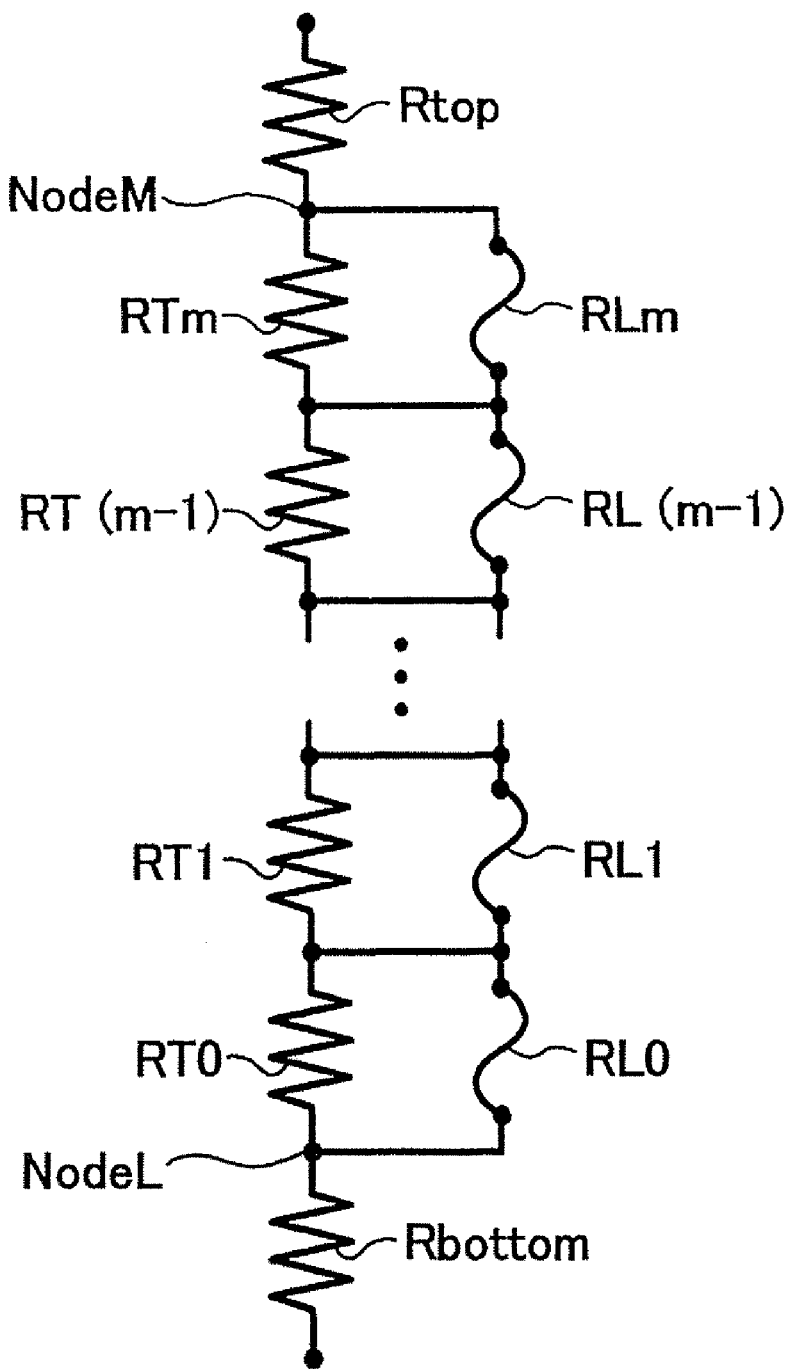
FIG. 16 illustrates an exemplary circuit of tunable resistances.

In this preferred resistance circuit, by electrically connecting selected terminals N0 to Nm, a prescribed serial resistance value can be obtained between a terminal NodeM, which is located between the resistance elements Rtop and RTm, and a terminal NodeL, which is located between the resistance elements Rbottom and RT0. Thereby, precision can be improved in the manufacturing process. Thus, this resistance circuit can be applied to a pair of division resistances R1 and R2 included in the constant voltage generation and voltage detection circuits of FIG. 14 and FIG. 15.

However, the electric circuit capable of determining a connection condition using a semiconductor device manufacturing apparatus and method according to the present invention is not limited to that shown in FIG. 13. That is, any electric circuit may fall within the present invention, if a connection condition can be determined by selectively connecting and disconnecting terminal units each having two or more electrically separated terminals.

Even if the thermo curable plastic sealant is preferably used as an uncured plastic sealant in the above-mentioned embodiment, the present invention is not limited thereto and includes a modification in which other plastic material such as a light curable plastic of an ultra violet light curable type can be utilized. Further, for the curing process applied to the uncured plastic sealant layer, a prescribed process may be performed in accordance with a performance of the uncured plastic sealant, for example, a light irradiation process, if the uncured plastic sealant is the light curable plastic, for example.

Further, in the above-mentioned embodiments, temperatures of the metal paste in the metal paste containers 15 of the discharge heads 11, 12, 61, and 71 and those of the metal paste and uncured plastic sealant in the liquid supply path 17 and the discharge container 19, and the temperature of the surface 1a of the semiconductor wafer substrate 1 are controlled. However, the semiconductor device manufacturing apparatus and method of the present invention are not limited thereto. Specifically, such temperature control can be omitted if viscosity of the metal paste and uncured plastic sealant can maintain an appropriate condition without temperature control.

Further, in the preferred embodiment of the semiconductor device manufacturing apparatus described with reference to FIGS. 2, 5, and 9, by fixing the position of the discharge heads 11, 12, 61, and 71 and moving the substrate holding section 3, the semiconductor wafer substrate is positioned. However, the present invention is not limited thereto. That is, any configuration is employable, if it can position the semiconductor wafer substrate with regard to the discharge nozzle arranged in the discharge head. Specifically, only the discharge head or both of the discharge head and the substrate holding section can be moved.

Further, the discharge head 11 with the piezoelectric system is employed as a discharge mechanism constituting a semiconductor device manufacturing apparatus in the present invention. However, the discharge mechanism is not limited to this type.

Specifically, a printer head for ink jet use such as a thermal jet system rapidly heating liquid with a heater and using a generated bubble as pressure required when discharging liquid, a valve system controlling an electromagnetic valve to open and close so as to adjust liquid discharge, etc., are applicable to the discharge mechanism.

Further, the discharge mechanism constituting the semiconductor device manufacturing apparatus of the present invention is not limited to that employing the printer head for ink jet printer use. That is, various configurations are employable if they include a function of discharging a liquid drop of metal paste contained in a metal paste container section toward a surface of a semiconductor wafer substrate held by a substrate holding section.

Further, the metal paste container sections 15 are arranged in respective discharge nozzles 13. However, single metal paste container section can be commonly used by a plurality of discharge nozzles. Further, in the discharge head 11, the plurality of discharge nozzles 13 is arranged. However, the number of discharge nozzles can be one.

Numerous additional modifications and variations of the present invention are possible in light of the above teachings. It is therefore to be understood that within the scope of the appended claims, the present invention may be practiced otherwise than as specifically described herein.

What is claimed is:

1. A method of manufacturing a semiconductor device, comprising the steps of:
    providing a semiconductor wafer substrate comprising:
        a plurality of terminal units formed overlying a surface of the semiconductor wafer substrate, each terminal unit comprising two or more electrically separated terminals each terminal being connected to a device circuit, and
        an insulation layer having a respective opening overlying a formation position of each terminal unit; and
    electrically connecting at least one pair of the terminals of at least one of the plurality of terminal units by selectively coating with metal paste the opening overlying the at least one terminal unit to be electrically connected, wherein said electrically connecting at least one pair of terminals changes the electrical properties of said device circuit.

2. The method of manufacturing a semiconductor device according to claim 1, wherein said step of connecting the at least one pair of terminals of at least one terminal unit is performed by scanning a discharge nozzle while discharging a liquid drop of a certain amount of the metal paste such that the opening is coated with the metal paste overlying the at least one terminal unit to be electrically connected.

3. The method of manufacturing a semiconductor device according to claim 2, wherein a smaller volume of the liquid drop is discharged in the vicinity of the margin of the opening than in the other regions of the substrate.

4. The method of manufacturing a semiconductor device according to claim 1, wherein said step of coating the metal paste in the opening is performed by selecting one of a film thickness, a line width or type of the metal paste to be coated in the opening, or a combination thereof.

5. The method of manufacturing a semiconductor device according to claim 1, further comprising the step of:
    sealing the openings, whether coated or not coated, after the step of connecting the terminals of the at least one terminal unit.

6. The method of manufacturing a semiconductor device according to claim 5, wherein said step of sealing the openings is performed by filling the openings with uncured plastic sealant while scanning, the discharge nozzle discharging a certain amount of the uncured plastic sealant, and curing the uncured plastic sealant thereafter.

* * * * *